United States Patent
Briquet et al.

(10) Patent No.: US 10,401,921 B2
(45) Date of Patent: Sep. 3, 2019

(54) PROTECTIVE CASE FOR A COMPUTER AND METHOD FOR MANUFACTURING SUCH A CASE

(71) Applicants: CONTINENTAL AUTOMOTIVE FRANCE, Toulouse (FR); CONTINENTAL AUTOMOTIVE GmbH, Hannover (DE)

(72) Inventors: Capucine Briquet, Toulouse (FR); Jerome Chastanet, Toulouse (FR)

(*) Notice: Subject to any disclaimer, the term of this patent is extended or adjusted under 35 U.S.C. 154(b) by 120 days.

(21) Appl. No.: 15/428,583

(22) Filed: Feb. 9, 2017

(65) Prior Publication Data
US 2017/0235344 A1      Aug. 17, 2017

(30) Foreign Application Priority Data
Feb. 12, 2016 (FR) .................... 16 51126

(51) Int. Cl.
    *G06F 1/18*     (2006.01)
    *G06F 1/20*     (2006.01)
    (Continued)

(52) U.S. Cl.
    CPC .......... *G06F 1/181* (2013.01); *B60R 16/0231* (2013.01); *G06F 1/183* (2013.01); *G06F 1/20* (2013.01); *H05K 5/0213* (2013.01)

(58) Field of Classification Search
    CPC .... G06F 1/181–182; G06F 1/183; G06F 1/20; H05K 7/20218–20381;
    (Continued)

(56) References Cited

U.S. PATENT DOCUMENTS 5,682,289 A * 10/1997 Schwegler .............. G06F 1/183
                                                        361/679.33
5,894,407 A *  4/1999 Aakalu .............. H05K 7/20154
                                                        165/185
(Continued)

FOREIGN PATENT DOCUMENTS

EP        1 786 251 A2     5/2007

OTHER PUBLICATIONS

Design Guide line: 10311111 SPE 0000 AB New venting solution.
FR Search Report, dated Oct. 5, 2016, from corresponding FR application.

*Primary Examiner* — Anthony M Haughton
*Assistant Examiner* — Razmeen Gafur
(74) *Attorney, Agent, or Firm* — Young & Thompson

(57) ABSTRACT

The present invention proposes a protective case for a motor vehicle computer, the case including a ventilation filter (50) and at least one wall (41) including a mounting portion (410) for mounting the ventilation filter, in which portion an opening (42) and at least one air flow channel (43) extending from the opening are formed, the ventilation filter including a membrane (51) covering the opening and a protective member (52) for protecting the membrane, mounted on the mounting portion and defining at least one aperture opening onto the flow channel (43), the flow channel being configured so as to prevent the membrane from being reached by a flow of water traveling along a straight path from the aperture, in order to prevent damage to the membrane by the flow of water.

17 Claims, 2 Drawing Sheets

(51) Int. Cl.
*H05K 5/02* (2006.01)
*B60R 16/023* (2006.01)

(58) Field of Classification Search
CPC .. H05K 7/20409–20418; H05K 7/20009–202; H05K 5/0213; H01L 23/367–3677; H01L 23/473; H01L 23/46–467; B60R 16/0231
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | | |
|---|---|---|---|---|---|
| 6,088,225 | A * | 7/2000 | Parry | | H02B 1/50 165/104.33 |
| 6,094,345 | A * | 7/2000 | Diemunsch | | H05K 7/20727 165/80.3 |
| 6,172,873 | B1 * | 1/2001 | Davis | | H05K 7/1428 248/27.1 |
| 6,506,110 | B1 * | 1/2003 | Borisch | | H05K 5/0213 454/184 |
| 7,262,964 | B1 * | 8/2007 | Barsun | | H05K 7/20154 165/104.33 |
| 9,351,618 | B2 * | 5/2016 | Van Der Kooi | | A47L 9/02 |
| 2003/0133268 | A1 * | 7/2003 | Radosevich | | H02M 1/44 361/704 |
| 2005/0225947 | A1 * | 10/2005 | Araujo | | H05K 5/0008 361/719 |
| 2006/0225910 | A1 * | 10/2006 | Chamberlain | | G01V 1/16 174/50 |
| 2006/0232948 | A1 * | 10/2006 | Haager | | H05K 7/1417 361/752 |
| 2007/0066215 | A1 * | 3/2007 | Song | | B01D 46/0004 454/329 |
| 2007/0109730 | A1 * | 5/2007 | Shigyo | | H05K 5/0052 361/600 |
| 2007/0153484 | A1 * | 7/2007 | Caines | | H05K 5/061 361/707 |
| 2007/0222305 | A1 * | 9/2007 | Takada | | H02K 1/2786 310/43 |
| 2008/0030951 | A1 * | 2/2008 | Hall | | H05K 7/20918 361/696 |
| 2008/0248841 | A1 * | 10/2008 | Foo | | G06F 1/1626 455/575.1 |
| 2008/0265586 | A1 * | 10/2008 | Like | | B60R 16/04 290/38 R |
| 2009/0047896 | A1 | 2/2009 | Wolff | | |
| 2009/0154106 | A1 * | 6/2009 | Lynch | | H01L 23/3677 361/707 |
| 2011/0211311 | A1 * | 9/2011 | Shinoda | | H05K 5/0047 361/694 |
| 2012/0060693 | A1 * | 3/2012 | Sasaki | | B01D 46/543 96/139 |
| 2012/0073873 | A1 * | 3/2012 | Nash | | H05K 9/0045 174/382 |
| 2012/0118772 | A1 * | 5/2012 | Ellis-Brown | | G06F 1/1628 206/320 |
| 2012/0187902 | A1 * | 7/2012 | Wang | | H02J 7/00 320/107 |
| 2012/0281365 | A1 * | 11/2012 | Lima | | H05K 7/20418 361/720 |
| 2012/0320532 | A1 * | 12/2012 | Wang | | H05K 1/165 361/720 |
| 2013/0186121 | A1 * | 7/2013 | Erb | | F24F 3/1417 62/238.1 |
| 2014/0198144 | A1 * | 7/2014 | Miyajima | | B41J 2/17556 347/6 |
| 2014/0220876 | A1 * | 8/2014 | Furuuchi | | F24F 7/04 454/241 |
| 2014/0347323 | A1 * | 11/2014 | Colgate | | G06F 3/016 345/174 |
| 2015/0014796 | A1 * | 1/2015 | Dehe | | B81B 7/0016 257/416 |
| 2015/0044960 | A1 * | 2/2015 | Hara | | B29C 45/14467 454/254 |
| 2015/0062940 | A1 * | 3/2015 | Scagliarini | | F21V 31/03 362/487 |
| 2015/0201527 | A1 * | 7/2015 | Stringer | | H05K 7/20009 165/80.3 |
| 2015/0201528 | A1 * | 7/2015 | Lebo | | G02B 6/4269 361/703 |
| 2015/0303503 | A1 * | 10/2015 | Winand | | G06F 1/1635 361/679.02 |
| 2015/0313034 | A1 * | 10/2015 | Yano | | H05K 5/0213 428/68 |
| 2015/0334863 | A1 * | 11/2015 | Beer | | H05K 5/0213 220/745 |
| 2016/0043017 | A1 * | 2/2016 | Jones | | H01L 21/50 361/719 |
| 2016/0198247 | A1 * | 7/2016 | Cheney | | H04R 1/02 381/334 |
| 2017/0220068 | A1 * | 8/2017 | Youlios | | G06F 1/1618 |

* cited by examiner

PROTECTIVE CASE FOR A COMPUTER AND METHOD FOR MANUFACTURING SUCH A CASE

FIELD OF THE INVENTION

The present invention relates to the field of motor vehicle computers; more particularly, it concerns a protective case for a motor vehicle computer.

BACKGROUND OF THE INVENTION

A motor vehicle comprises, in a known way, a plurality of on-board computers, each of which can be used to control one or more pieces of equipment of the vehicle, notably operating parameters of the engine (such as fuel injection), electrical parameters of the vehicle, the power-assisted steering system of the vehicle, and others.

Conventionally, an on-board computer takes the form of a case in which a printed circuit is mounted, the case being intended, notably, to protect the printed circuit from impact and sprays of water.

In a known way, the electronic components of the printed circuit give off heat when in use, causing a rise in the temperature and pressure inside the case. This rise in temperature and pressure may damage the electronic components of the printed circuit, creating a serious problem.

It has therefore been proposed that a ventilation filter be mounted on the case, in an opening formed for this purpose through a wall of the case to allow air to pass between the inside and the outside of the case, while preventing the penetration of water into the case.

The document EP 1 786 251 A2 discloses a case on which a first type of ventilation filter is mounted. This filter takes the form of a plastic plug composed of an air flow tube to which a protective member is fastened. This air flow tube comprises a first end mounted in the opening of the case and a second end, at which end a membrane, configured to allow air to flow between the inside and the outside of the case, is mounted. The protective member enables the membrane to be protected, notably, from high-pressure water sprays that may strike the case during the standard strength tests that are conducted on this type of computer. For this purpose, the protective member takes the form of a cylindrical cap of circular section, the diameter of which is greater than the diameter of the tube, so that the tube is completely covered. This cap is closed at one end, to protect the membrane from high-pressure water sprays, and is partially open in its lower part, to allow air to flow through the membrane.

However, this type of filter is both difficult and expensive to manufacture and mount on the case, which is a considerable problem. Consequently, a second ventilation filter solution has been proposed, in which a portion of the case is modified by stamping, to form an opening at the end of the stamped portion and air flow channels extending into the stamped portion from the opening. A ventilation membrane is mounted directly in the opening, and a protective membrane, in the form of a rectangular plate pierced at its corners, is mounted on top of the stamped portion so as to protect the membrane from high-pressure water sprays while allowing air to flow in the channels.

However, it has been found that high-pressure water sprays may pass through the pierced corners of the protective plate, flow into the channels and reach the membrane at a pressure of more than 0.83 bar, which may damage the membrane, notably by detachment or delamination. Such damage may allow water to reach the printed circuit, resulting in the aforementioned problems.

SUMMARY OF THE INVENTION

The invention is therefore intended to resolve these problems, at least partially, by proposing a simple, effective and reliable solution to prevent high-pressure water sprays from damaging the membrane.

For this purpose, the invention proposes a protective case for a motor vehicle computer, said case defining an internal space in which a printed circuit of said computer is to be mounted, the case comprising a ventilation filter and at least one wall comprising a portion for the mounting of said ventilation filter, in which portion an opening and at least one air flow channel extending from said opening are formed, the ventilation filter comprising a membrane covering the opening and a protective member for protecting the membrane, mounted on the mounting portion and defining at least one aperture opening onto the flow channel, the flow channel being configured so as to prevent the membrane from being reached by a flow of water traveling along a straight path from the aperture, in order to prevent damage to the membrane by said flow of water.

The case according to the invention is such that the ventilation filter membrane is protected from flows of water by the flow channel, which prevents such a flow of water from directly reaching the membrane. Thus this channel enables at least some of the flow of water in the channel to be deflected between the aperture and the membrane, to prevent a straight path of the flow of water and thus avoid direct contact between the membrane and the flow of water, in order to protect the membrane. This also makes it possible to prevent the detachment and/or delamination of the membrane resulting from a flow of water traveling laterally to said membrane. Furthermore, this flow channel is easy to manufacture, thereby limiting the manufacturing costs of the case.

Preferably, the mounting portion comprises at least one rib extending projectingly into the flow channel in order to deflect at least some of the flow of water in the channel.

Advantageously, the rib extends transversely with respect to the flow channel, so as to reduce the pressure of the flow of water traveling through the channel.

Preferably, the flow channel is at least partially curved, in order to deflect at least some of the flow of water in the channel. Also preferably, the flow channel comprises at least one bend.

Advantageously, the flow channel is configured to allow water to be drained out of the ventilation filter, to prevent the stagnation of water in said ventilation filter.

The invention also relates to a motor vehicle computer, said computer comprising a case as described above and a printed circuit mounted in the internal space of said case.

The invention also proposes a motor vehicle comprising at least one computer as described above.

Finally, the invention relates to a method for manufacturing a protective case for a motor vehicle computer, the case comprising a ventilation filter and at least one wall comprising a portion for mounting said ventilation filter, the method comprising a step of stamping the mounting portion so as to form at least one flow channel configured to prevent a flow of water from traveling along a straight path to the ventilation filter in said channel.

Preferably, in the step of stamping the case, at least one rib is also formed in said flow channel.

BRIEF DESCRIPTION OF THE DRAWINGS

Other characteristics and advantages of the invention will be apparent from the following description which refers to the attached drawings, provided by way of non-limiting examples, in which identical references are given to similar objects.

DETAILED DESCRIPTION OF THE INVENTION

In the following text, a computer of a motor vehicle is described. It should be noted that this application does not limit the scope of the present invention, which may be applied to any type of vehicle.

Figure 1:
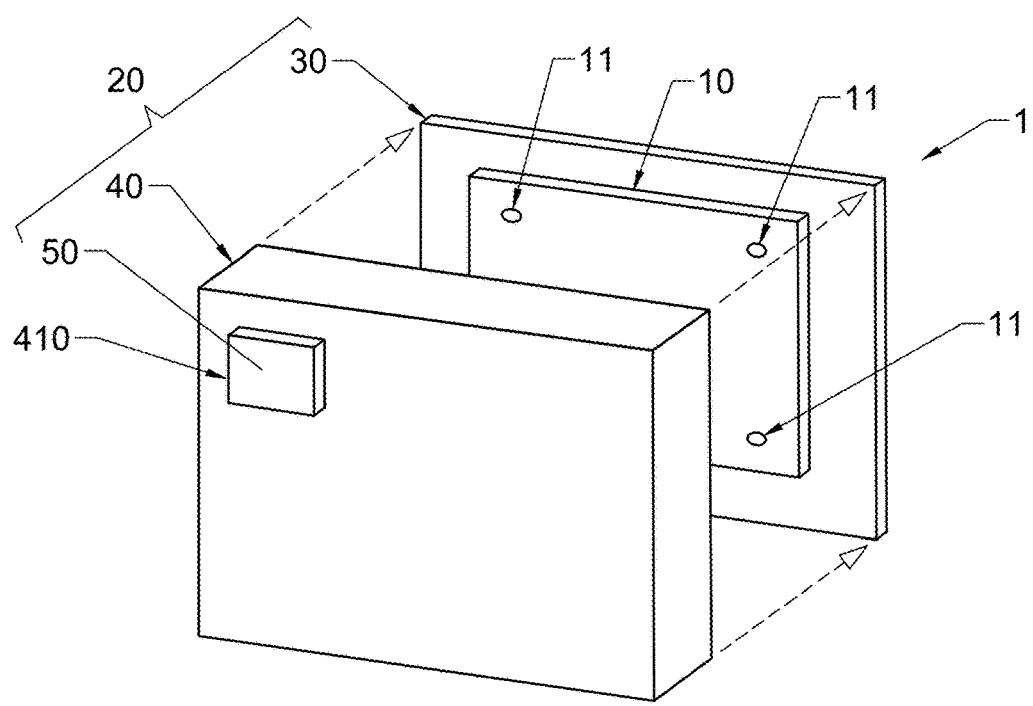
FIG. 1 shows schematically an embodiment of a computer according to the invention comprising a ventilation filter.

With reference to FIG. 1, the computer 1 comprises a printed circuit 10 protected by a protective case 20 comprising a support structure 30 for the printed circuit 10, a cover 40 adapted to cover the printed circuit 10 in order to protect it, and a ventilation filter 50 for the passage of air between the inside and the outside of the protective case 20.

Additionally, the computer 1 is, in a known manner, adapted to be linked to a communications network of the motor vehicle, notably via a connector (not shown) linked to the printed circuit 10.

The support structure 30 comprises a substantially flat main body principal on which the printed circuit 10 is mounted, for example by means of a plurality of rivets passing through mounting openings 11 for mounting the printed circuit 10.

The cover 40 is mounted on the support structure 30 to form the protective case 20 of the printed circuit 10. A gasket (not shown) may be mounted between the cover 40 and the support structure 30 to ensure the leak-tightness of the protective case 20.

The cover 40, together with the support structure 30, defines an internal space of the protective case 20, in which the printed circuit 10 is mounted.

Thus the cover 40 comprises a wall 41 comprising a mounting portion 410 for mounting the ventilation filter 50. In the example shown in the drawings, a mounting portion 410 located on the cover 40 is shown; evidently, however, this portion could be located on another part of the protective case 20 adapted to allow air to pass between the inside and the outside of the protective case 20.

Figure 2:
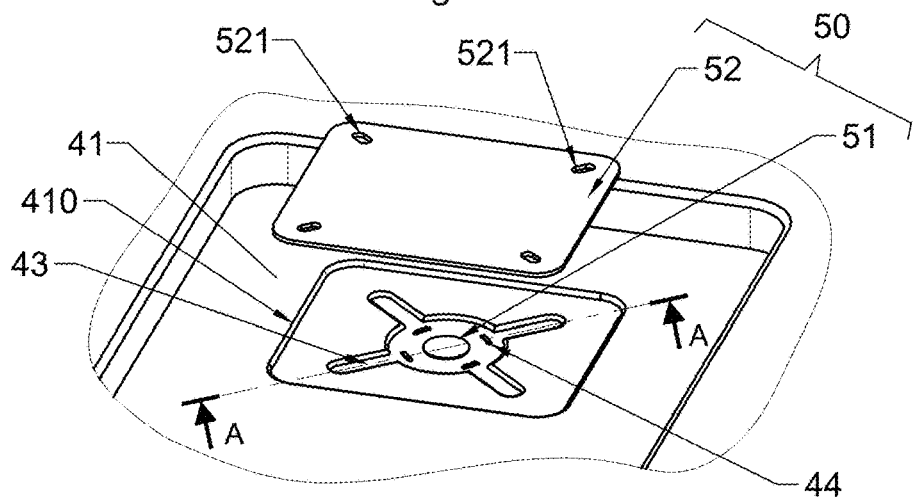
FIG. 2 shows schematically the ventilation filter of FIG. 1.
Figure 3:
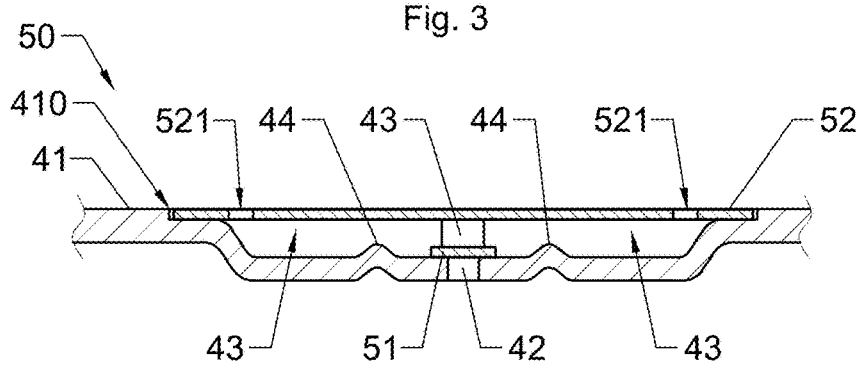
FIG. 3 shows schematically a sectional view of the ventilation filter of FIG. 2 taken along the section line A-A.

As shown in FIGS. 2 and 3, the mounting portion 410 comprises an opening 42 covered by a membrane 51 of the ventilation filter 50, air flow channels 43 guiding the air to the opening 42, and ribs 44 located in the channels 43.

The opening 42 extends through the wall 41 of the cover 40 so as to connect the internal space of the protective case 20 with the outside, thereby allowing air to pass through the membrane 51.

The flow channels 43 extend from the opening 42 to guide the air entering and/or leaving the protective case 20 via the membrane 51 and the opening 42. The flow channels 43 are formed in the wall 41 of the cover 40 by stamping. Advantageously, since the cover 40 is formed by stamping, the flow channels 43 are formed in the same stamping operation, thereby making their manufacture faster and easier, as described below. The flow channels 43 thus take the form of a surface which is at least partially curved.

In this example, the cover 40 comprises four flow channels 43, distributed uniformly around the opening 42 to form an X-shaped flow network. In other words, the flow channels 43 form a cross around the opening 42. Four flow channels 43 are shown in the drawings; however, this number could evidently be different, notably greater or less than four.

A flow channel 43 comprises a proximal end and a distal end relative to the opening 42, to guide the air to the opening 42.

According to an advantageous aspect of the invention, the flow channels 43 are adapted to reduce the pressure of a high-pressure flow of water traveling through said flow channels 43 to a level below an intrinsic damage threshold of the membrane 51, for example 0.83 bar.

For this purpose, according to an embodiment of the invention, each flow channel 43 comprises at least one rib 44 extending projectingly from the wall of the flow channel 43. This rib 44 thus forms an obstacle which the flow of water strikes, thereby reducing the pressure of the flow of water traveling through the flow channel 43. The rib 44 is located at the proximal end of the flow channel 43, so as to optimize the reduction of the pressure of the flow of water near the opening 42. The rib 44 extends over a height in the range from 0.5 mm to 1.5 mm. The rib 44 extends over a width in the range from 0.5 mm to 1 mm. These dimensions of the rib 44 thus ensure that no flow of water reaches the opening 42 directly.

Advantageously, the rib 44 is made of the same material as the wall 41 of the cover 40. This rib 44 is produced by stamping, as described below.

As shown in FIG. 2, the rib 44 extends substantially transversely in the flow channel 43. The term "transversely" is taken to mean perpendicularly to the direction of a flow of water in the flow channel 43.

The ventilation filter 50 allows air to pass between the outside of the protective case 20 and the internal space of the protective case 20.

For this purpose, as described above, the ventilation filter 50 comprises a membrane 51 covering the opening 42 and a member 52 for protecting said membrane 51. In this example, the membrane 51 extends over the opening 42. Evidently, the membrane 51 could equally well be mounted under or inside the opening 42.

In this non-limiting example, the membrane 51 is fastened to the wall 41, preferably by bonding. The membrane 51 is made of a material adapted to allow air, but not water, to pass through. Thus, air can flow between the inside and the outside of the protective case 20 through the membrane 51, so as to ventilate the internal space of the protective case 20, while the printed circuit 10 is protected from water.

The membrane 51 is characterized by its resistance to a flow of water up to an intrinsic damage threshold, of about 0.83 bar for example, below which the membrane 51 is not damaged.

As explained above, the pressure of a flow of high-pressure water entering the flow channel 43, at a pressure greater than or equal to 80 bar for example, may thus be reduced to a level below the intrinsic damage threshold of the membrane 51 at its exit from the flow channel 43, so that the membrane 51 is not damaged.

The protective member 52 is fastened to the wall 41 and on top of the membrane 51, to protect the latter, notably against flows of water. The protective member 52 covers the mounting area. The protective member 52 covers the flow channels 43 so as to form, with the latter, conduits for guiding an air flow to the membrane 51. In other words, the protective member 52 covers the flow channels 43. The protective member 52 takes the form of a rectangular plate having an opening 521 in each corner, forming an aperture for access to each flow channel 43. Thus, air from outside the protective case 20 can flow from an aperture to the membrane 51 through the flow channels 43.

Figure 4:
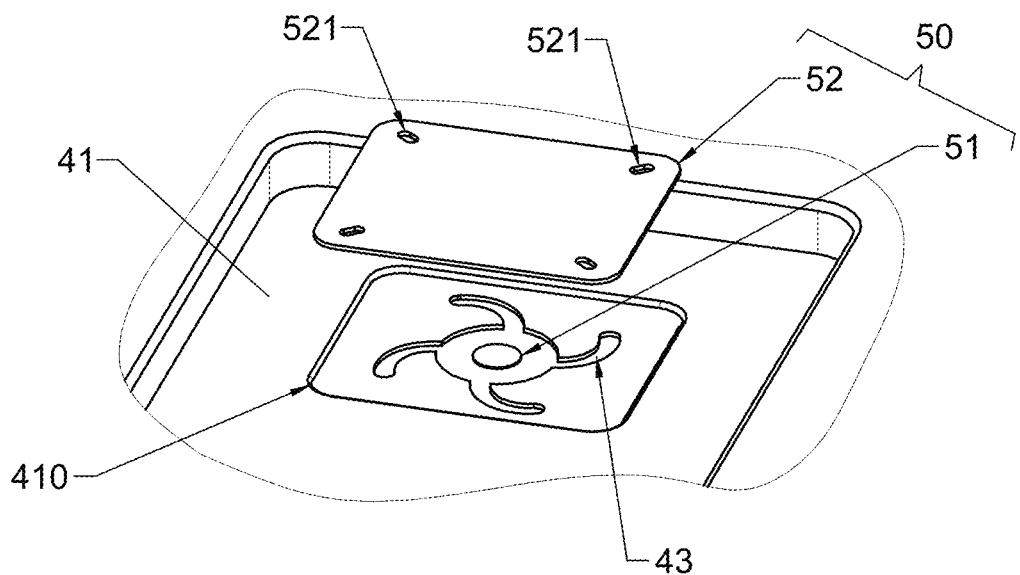
FIGS. 4 and 5 show schematically other embodiments of the ventilation filter according to the invention.
Figure 5:
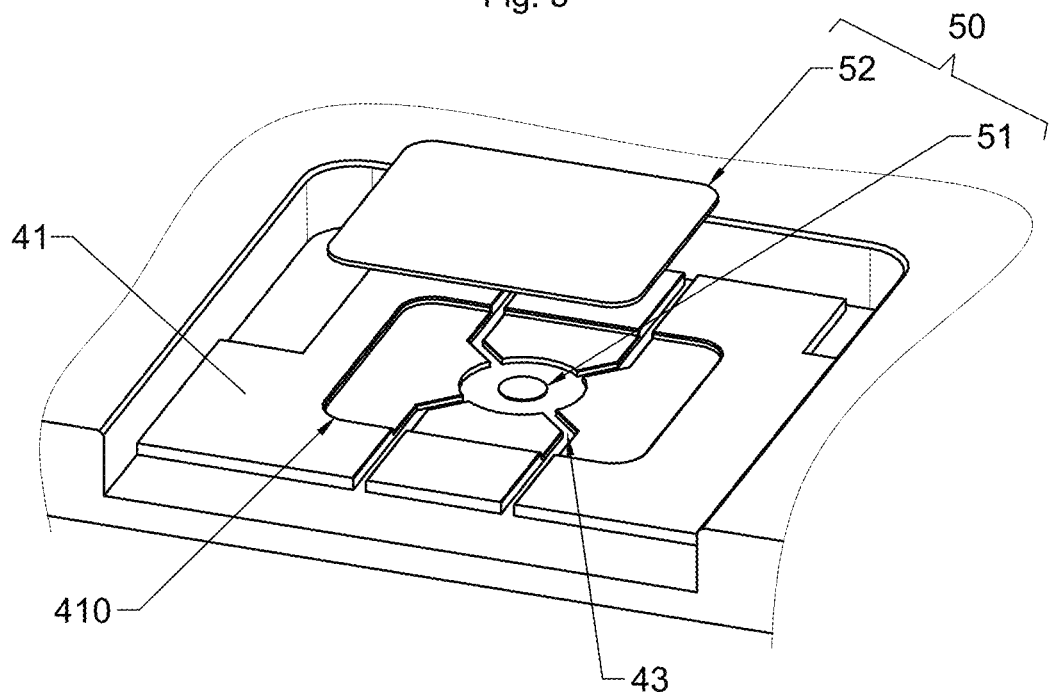

Flow channels 43 having ribs 44 have been described; alternatively or additionally, however, each flow channel 43 may be curved, as shown in FIGS. 4 and 5. The term "curved" is taken to mean that a flow channel 43 does not extend along a straight path between its two ends. With reference a FIG. 4, curved flow channels 43 thus form a spiral around the opening 42. The curvature of the flow channel 43 can thus prevent a direct flow of water from reaching the opening 42. This is because the flow of water travels along a straight path, as a result of which said flow of water strikes the curved flow channel 43, thereby reducing its pressure in the proximity of the opening 42.

A curved flow channel 43 may thus provide a path which is at least partially circular, as shown in FIG. 4.

With reference to FIG. 5, a flow channel 43 may also include at least one bend. In other words, the path of the flow channel 43 includes a change of direction, preferably through an angle greater than 15°, or more preferably an angle greater than 35°.

According to an embodiment illustrated in FIG. 5, the flow channel 43 opens, at its distal end, horizontally from the wall 41. Thus the aperture for access to such a flow channel 43 is formed at this end. In other words, the protective member 52 does not include an opening 521. With this horizontally opening channel, it is advantageously possible to drain water out of the ventilation filter 50, without any restriction on the mounting of the computer 1, and notably without the need for a minimum inclination.

The method of manufacturing a computer according to the invention will now be described.

The mounting portion 410 for mounting the ventilation filter 50 is produced by stamping. For this purpose, the wall 41 is placed in a stamping machine in order to form a stamped shape allowing said ventilation filter 50 to be mounted.

In this step of stamping the wall 41, the flow channels 43 are formed. Thus the forming of the flow channels 43 facilitates the forming of curved channels adapted to prevent a flow of water from directly reaching the opening 41.

Advantageously, the ribs 44 are also formed in said step of stamping the protective case 20.

The printed circuit 10 is then fastened to the support structure 30, and the cover 40 is mounted on said support structure 30 to seal the protective case 20 around the printed circuit 10.

The membrane 51 is then bonded onto the opening 42, after which the protective member 52 is bonded onto the stamped form to protect the membrane 51.

Because of the case according to the invention, the membrane is protected from any detachment of the mounting portion and/or any degradation, notably due to delamination, due to the action of a flow of water traveling laterally with respect to the membrane.

It should also be noted that the present invention is not limited to the examples described above, and may be varied in numerous ways within the capacity of those skilled in the art.

The invention claimed is:

1. A protective case (20) for a motor vehicle computer (1), said case (20) defining an internal space in which a printed circuit (10) of said computer (1) is to be mounted, the case (20) comprising:
   a ventilation filter (50); and
   a wall (41) comprising a recession in a thickness direction of the wall (41) that forms a mounting portion (410) for mounting said ventilation filter (50) therein, said mounting portion (410) having formed therein an opening (42) extending through an entire thickness of the mounting portion (410) of the wall (41), and at least one air flow channel (43) formed as a depression in a surface of the mounting portion (410) and extending away from said opening (42),
   the ventilation filter (50) comprising a membrane (51) covering the opening (42), and a protective member (52) for protecting the membrane (51),
   the protective member (52) mounted over the mounting portion (410) so as to cover both the protective membrane (51) and the at least one air flow channel (43), the protective member (52) having at least one aperture extending entirely through a thickness thereof, each said at least one aperture being in fluid communication with a corresponding one of said at least one flow channel (43),
   said at least one flow channel (43) being configured so as to prevent the membrane (51) from being reached by a flow of water traveling along a straight path from said at least one aperture, in order to prevent the membrane from being damaged by said flow of water, and
   the mounting portion (410) further comprising at least one rib (44) extending projectingly into said at least one flow channel (43).

2. The case (20) according to claim 1, wherein the rib (44) extends transversely to the flow channel (43).

3. The case (20) according to claim 2, wherein the flow channel (43) is at least partially curved.

4. The case (20) according to claim 2, wherein the flow channel (43) comprises at least one bend.

5. A computer (1) for a motor vehicle, said computer (1) comprising a protective case (20) according to claim 2 and a printed circuit (10) mounted in the internal space of said case (20).

6. The case (20) according to claim 3, wherein the flow channel (43) comprises at least one bend.

7. A computer (1) for a motor vehicle, said computer (1) comprising a protective case (20) according to claim 3 and a printed circuit (10) mounted in the internal space of said case (20).

8. A computer (1) for a motor vehicle, said computer (1) comprising a protective case (20) according to claim 4 and a printed circuit (10) mounted in the internal space of said case (20).

9. A computer (1) for a motor vehicle, said computer (1) comprising a protective case (20) according to claim 6 and a printed circuit (10) mounted in the internal space of said case (20).

10. The case (20) according to claim 1, wherein the flow channel (43) is at least partially curved.

11. The case (20) according to claim 10, wherein the flow channel (43) comprises at least one bend.

12. A computer (1) for a motor vehicle, said computer (1) comprising a protective case (20) according to claim 10 and a printed circuit (10) mounted in the internal space of said case (20).

13. A computer (1) for a motor vehicle, said computer (1) comprising a protective case (20) according to claim 11 and a printed circuit (10) mounted in the internal space of said case (20).

14. The case (20) according to claim 1, wherein the flow channel (43) comprises at least one bend.

15. A computer (1) for a motor vehicle, said computer (1) comprising a protective case (20) according to claim 14 and a printed circuit (10) mounted in the internal space of said case (20).

16. A computer (1) for a motor vehicle, said computer (1) comprising a protective case (20) according to claim 1 and a printed circuit (10) mounted in the internal space of said case (20).

17. A motor vehicle comprising at least one computer (1) according to claim 16.

* * * * *